(12) United States Patent
Kociak et al.

(10) Patent No.: US 11,830,718 B2
(45) Date of Patent: Nov. 28, 2023

(54) STIMULATED OR NON-EQUILIBRIUM ENERGY-LOSS AND ENERGY-GAIN SPECTROSCOPY DEVICE

(71) Applicants: CENTRE NATIONAL DE LA RECHERCHE SCIENTIFIQUE, Paris (FR); UNIVERSITE PARIS-SACLAY, Saint-Aubin (FR)

(72) Inventors: Mathieu Kociak, Palaiseau (FR); Marcel Tence, Issy les Moulineaux (FR); Jean-Denis Blazit, Forges les Bains (FR); Pabitra Das, Bures-sur-Yvette (FR)

(73) Assignees: CENTRE NATIONAL DE LA RECHERCHE SCIENTIFIQUE, Paris (FR); UNIVERSITE PARIS-SACLAY, Saint-Aubin (FR)

( * ) Notice: Subject to any disclaimer, the term of this patent is extended or adjusted under 35 U.S.C. 154(b) by 406 days.

(21) Appl. No.: 16/830,646

(22) Filed: Mar. 26, 2020

(65) Prior Publication Data
US 2020/0312649 A1 Oct. 1, 2020

(30) Foreign Application Priority Data
Mar. 27, 2019 (FR) .................... 1903201

(51) Int. Cl.
*H01J 49/14* (2006.01)
*H01J 49/00* (2006.01)
*H01J 49/06* (2006.01)

(52) U.S. Cl.
CPC ........ *H01J 49/147* (2013.01); *H01J 49/0063* (2013.01); *H01J 49/061* (2013.01)

(58) Field of Classification Search
CPC .... H01J 49/147; H01J 49/0063; H01J 49/061; H01J 37/228; H01J 37/26; H01J 37/045;
(Continued)

(56) References Cited

U.S. PATENT DOCUMENTS

| 8,429,761 B2* | 4/2013 | Zewail | H01J 37/28 850/30 |
| 2011/0278451 A1* | 11/2011 | Tiemeijer | H01J 37/05 250/307 |

(Continued)

OTHER PUBLICATIONS

Feist et al., Ultrafast transmission electron microscopy using a laser-driven field emitter: Femtosecond resolution with a high coherence electron beam, 176 Ultramicroscopy 63 (2017) (Year: 2017).*

(Continued)

*Primary Examiner* — Kiet T Nguyen
(74) *Attorney, Agent, or Firm* — Greer, Burns & Crain, Ltd

(57) ABSTRACT

A spectroscopy device including:
an electron source arranged to emit a flux of electrons towards a sample,
a pulsed photon source emitting photon pulses towards the sample,
at least one spectrometer for receiving a flux of electrons originating from the sample,
at least one electron detector; and
at least one deflector, between the electron source and the at least one electron detector, synchronized with the pulsed photon source to allow or prevent the passage of electrons emitted by the electron source, towards the electron detector.

13 Claims, 3 Drawing Sheets

(58) Field of Classification Search
CPC ....... H01J 2237/2626; H01J 2237/0432; H01J 2237/057; H01J 2237/24485; H01J 2237/2482; H01J 2237/2617; H01J 2237/28
USPC ........................................................ 250/311
See application file for complete search history.

(56) References Cited

U.S. PATENT DOCUMENTS

| | | | |
|---|---|---|---|
| 2012/0261586 A1 | 10/2012 | Knippels et al. | |
| 2016/0005566 A1* | 1/2016 | Zewail | G01N 23/20058 250/307 |
| 2016/0086762 A1* | 3/2016 | de Jong | H01J 37/285 250/305 |
| 2018/0130634 A1* | 5/2018 | Kondo | H01J 37/09 |
| 2018/0151329 A1* | 5/2018 | Luiten | H01J 37/244 |

OTHER PUBLICATIONS

Dömer, High-speed transmission electron microscope, 74 Review of Scientific Instruments 4369 (2003) (Year: 2003).*

Das et al., "Stimulated electron energy loss and gain in an electron microscope without a pulsed electron gun," Ultramicroscopy, vol. 203, pp. 44-51, Dec. 18, 2018.

French Search Report and Written Opinion from corresponding French Patent Application No. 1903201 dated Dec. 5, 2019 (9 pages).

* cited by examiner

STIMULATED OR NON-EQUILIBRIUM ENERGY-LOSS AND ENERGY-GAIN SPECTROSCOPY DEVICE

BACKGROUND

The present invention relates to a stimulated or non-equilibrium energy-loss and energy-gain spectroscopy device.

The field of the invention is the field of stimulated or non-equilibrium energy-loss and energy-gain spectroscopy.

Devices are known which make it possible to perform stimulated electron energy-loss and energy-gain spectroscopy (sEELS and sEEGS) or non-equilibrium electron energy-loss spectroscopy (non-equilibrium EELS) operating with a transmission electron microscope (TEM) or scanning transmission electron microscope (STEM). All of these solutions are based on the use of a pulsed electron source, in which emission of the electrons is stimulated by multiphoton laser pulses, and synchronized with laser pulses focused on the sample of interest.

These devices are functional but pose various problems, in particular:
 spectral resolution, as the latter is limited by the physics of the photons acting on the electron source,
 flexibility of use and adaptation to existing microscopes, and
 cost.

In fact, it is currently difficult and very expensive to obtain a pulsed electron source with high luminance and/or high spectral resolution. It is also difficult and expensive to adapt such sources to existing microscopes. In addition, the use of a pulsed electron source in these devices generally makes them unsuitable for other applications, so that these devices are dedicated to sEELS/sEEGS or non-equilibrium EELS spectroscopy, and do not allow other types of imaging to be carried out in parallel. It is therefore necessary to provide another electron source as a replacement for, or in addition to, the pulsed electron source.

An aim of the invention is to overcome the aforementioned drawbacks.

Another aim of the invention is to propose a stimulated or non-equilibrium energy-loss and energy-gain spectroscopy device that is less expensive and less complex.

Another aim of the invention is to propose a stimulated or non-equilibrium energy-loss and energy-gain spectroscopy device that is easy to adapt to an existing microscope.

Another aim of the invention is to propose a stimulated or non-equilibrium energy-loss and energy-gain spectroscopy device that does not require an electron source designed specifically for this application.

Another aim of the invention is to propose a stimulated or non-equilibrium energy-loss and energy-gain spectroscopy device that uses a standard electron source capable of being used for other applications.

Another aim of the invention is to propose a stimulated or non-equilibrium energy-loss and energy-gain spectroscopy device that makes it possible to obtain an improved temporal resolution, typically less than the duration of a laser pulse.

Another aim of the invention is to propose a device and a method that make it possible to carry out such measures and have an optimum temporal and spectral resolution, while being inexpensive.

SUMMARY

The invention makes it possible to achieve at least one of the aforementioned aims by a spectroscopy device comprising:

an electron source arranged to emit a flux of electrons towards a sample,
 a pulsed photon source emitting photon pulses towards said sample,
 at least one spectrometer for energetically dispersing a flux of electrons originating from the sample, and
 at least one electron detector.

The spectroscopy device according to the invention also comprises at least one deflector, between the electron source and the at least one electron detector, the action of which is synchronized with said pulsed photon source to allow or prevent the passage of electrons emitted by said electron source, towards said electron detector.

Thus, the deflector, being synchronized with the photon source, makes it possible to allow the passage of electrons which will reach, or which have reached, the sample at the same time as the photons or with an adjustable delay.

As a result, in the device according to the invention it is possible to use an electron source that is not pulsed as in the devices of the state of the art, and in particular a continuous electron source, which allows a cost saving and increased simplicity with respect to the devices implementing a pulsed electron source.

Thus, in the device according to the invention, the temporal resolution no longer depends on the photon source, and in particular on the duration of a pulse delivered by the photon source, but on the duration within which the deflector allows the passage of electrons towards the detector. Now, this duration can be chosen to be of the order of or smaller than the pulse duration, which makes it possible to obtain an increased temporal resolution with respect to the use of the same system without a deflector.

The performance of an electron microscope, for example in terms of luminance, spatial resolution, spectral resolution, is ultimately determined by that of the electron source thereof. In the invention described here, unlike the devices of the state of the art, as the source is not modified or affected by a laser pulse, the performance of the microscope is not degraded. In particular, the spectral resolution is greatly improved, as it no longer depends on the interaction between photons/electrons at the level of the electron source.

In addition, the device according to the invention can utilize any electron source conventionally used, for example in electron microscopes, and does not require the use of a pulsed electron source that has a complex architecture and high cost. Thus, the device according to the invention is less expensive, less complex and more flexible in terms of use and application.

In particular, the device according to the invention can be used together with other types of imaging that were formerly unsuitable and could not be used with a pulsed electron source.

Advantageously, the device according to the invention can comprise electronic optics making it possible to guide and/or shape the electron beam along the path thereof.

Non-limitatively, the electronic optics system can comprise an electron lens.

Advantageously, the device according to the invention can comprise a photonic optics system making it possible to guide and/or shape the photon beam along the path thereof.

Non-limitatively, the photonic optics system can comprise a photon lens.

Preferably, the electron source can be arranged to emit a continuous flux of electrons. This is then known as a continuous electron source.

Thus, the device according to the invention can be made using existing sources commonly used in this field, and in particular in current microscopes.

In particular, the device according to the invention can be constructed using the source from an existing microscope, and more particularly starting from an existing microscope and completing it with the missing components.

In an embodiment that is in no way limitative, the device according to the invention can comprise at least one deflector, called upstream deflector, positioned between the sample and the electron source.

In particular, in this embodiment, the upstream deflector makes it possible to allow or prevent the passage of electrons, upstream of the sample, before the electrons reach the sample.

The position of the deflector in this embodiment makes it possible to control the flux of electrons which excites the sample, and therefore potentially to limit the quantity of electrons incident on the sample. This allows the sample to be better protected from electron irradiation damage.

Alternatively or in addition, the device according to the invention can comprise at least one deflector, called downstream deflector, positioned between the sample and the electron detector.

The downstream deflector makes it possible to select electrons that originate from the sample, in particular electrons that have encountered the photon flux in the sample.

If in addition the deflector is placed after the imaging or spectroscopy means other than the electron loss and gain spectroscopy means, it does not disturb them, which makes it possible to use these imaging and spectroscopy means in the same way as during conventional usage. Indeed in this case, the properties of the electron beam are not degraded during the propagation thereof between the electron source and the deflector. This makes it possible to retain the physical properties of the electron beam, in particular the luminance and the spectral resolution, up to the imaging or spectroscopy means other than the loss or gain spectroscopy means.

In a particularly advantageous manner, the downstream deflector can influence the non-dispersive direction of the flux of electrons (i.e. the direction orthogonal to the direction of dispersion of the spectrometer) so as to carry out a line-by-line scan on an electron detector. In this case, the properties of the electron beam, in particular the luminance and the spectral resolution, are not affected, allowing in particular energy loss and gain spectra to be obtained without loss of spectral resolution.

In addition, an energy spectrum can be recorded on each line of the scanned detector. In this case, the temporal resolution is very greatly improved. By way of non-limitative example, for a passage time of the electron beam on the detector placed after the spectrometer of 100 ns (i.e. total exposure time of the detector by the flux of electrons, which can also correspond to the total open time of the deflector), this makes it possible typically to achieve a resolution of 100 ns divided by the number of lines of the scanned detector, i.e. for example a resolved spectrum at 1 ns for 100 lines.

Advantageously, at least one deflector, for example an upstream deflector, can be coupled to a mask to block one or more electrons passing through the sample when said sample is not illuminated by the photon source.

The mask can advantageously be a diaphragm, or a slit the width of which is arranged in the direction of deflection.

Alternatively or in combination, the electron detector can consist of a series of sub-detectors arranged perpendicularly to the direction of deflection and capable of being read independently.

Each sub-detector can therefore be illuminated over a shorter period than the passage time of the beam over the mask, and the independent reading of the different sub-detectors can increase the temporal resolution of the device.

The device according to the invention can comprise several detectors.

In this case, the device according to the invention can be adapted to different configurations of use, or different applications, without the need to modify the photon source and/or the electron source and while retaining the spectral and temporal qualities of these elements.

In particular, the device according to the invention can comprise:
at least one upstream deflector; and
at least one downstream deflector.

Such a device allows electrons reaching the detector to be selected with more rigour and greater accuracy.

The upstream deflector and the downstream deflector can be identical. Thus, the device according to the invention is robust, in the event of malfunction of one of the deflectors, while still providing the same performance.

Alternatively, the upstream deflector can have an open duration greater than the open duration of the downstream deflector.

By "open duration" is meant the period during which the deflector is in a state which allows the passage of electrons towards the sample so that the electrons reach said sample. In other words, it is the time during which the electron beam is allowed to flow, which corresponds to a "passing state" of the deflector.

In this case, the upstream deflector can allow the propagation of the electrons within a duration greater than that of the downstream deflector.

Thus, the downstream deflector has the function of selecting the electrons that will reach the electron detector and the upstream deflector has the function of limiting the period during which the sample is illuminated by the flux of electrons.

Thus, the upstream deflector makes it possible to limit the illumination duration of the sample by the electron beam and therefore makes it possible to limit damage to the sample.

As for the downstream deflector, it allows the electrons that will reach the detector to be selected.

Advantageously, the downstream and upstream deflectors can be synchronized so that the open period of the downstream deflector is wholly comprised within the open period of the upstream deflector. In other words, while the downstream deflector is allowing the passage of electrons, the upstream deflector is then also allowing electrons to pass. Conversely, when the upstream deflector allows the passage of electrons, the downstream deflector does not necessarily allow the passage of electrons.

Of course, in all cases, each deflector is preferentially synchronized with the photon source.

Preferably, at least one deflector can be a magnetic, electrostatic, photo-initiated deflector or a radiofrequency cavity. In other words, it is possible to use a wide variety of deflectors without affecting the operation of the device.

The device according to the invention can comprise exactly one single deflector.

The single deflector can be an upstream deflector, or a downstream deflector.

The device according to the invention can comprise exactly two deflectors:
an upstream deflector and a downstream deflector.

As indicated above, the device according to the invention comprises at least one electron detector.

This detector can be positioned after the spectrometer.

The detector makes it possible to record and exploit the spectrometer results.

The device according to the invention can comprise at least one serial detector.

By "serial detector" is meant a detector making it possible to acquire a spectrum sequentially (energy-by-energy) over time.

The at least one serial detector can be coupled to a slit, for example a rectangular slit, positioned before the at least one serial detector.

The at least one serial detector can be formed by a single detector or by a series of several detectors.

Alternatively or in addition, the device according to the invention can comprise at least one parallel detector.

By "parallel detector" is meant a detector arranged to detect all of the spectrum in one exposure.

The at least one parallel detector can be formed by a single detector or by a series of several detectors.

In an embodiment, the device according to the invention can comprise several detectors, in particular positioned downstream of the spectrometer.

In this case, an electronic optics system, for example a static deflector or a magnetic prism can be positioned upstream of said detectors. This electronic optics system can be arranged to route the flux of electrons to one of said detectors at a time.

At least one of the detectors can be positioned to receive a flux of electrons that is not deflected by the separation means at the exit of the spectrometer and at least one of the detectors can be positioned to receive a flux of electrons diverted by the separation means.

Such a device makes it possible to simultaneously detect and record several characteristics of the electron beam at the exit of the spectrometer, as a function of the detectors used.

The device according to the invention can comprise exactly two detectors.

The device according to the invention can comprise synchronization electronics, arranged to synchronize the at least one deflector with the photon source.

The synchronization electronics can be, or comprise, for example a microcontroller, a programmable logic circuit, an electronic chip, a calculator, delay lines or any electronic component, or also an electronic card, provided or programmed to carry out the functions described.

The synchronization electronics can command, or synchronize, the photon source and the, or each, deflector by one or more signals initiating, simultaneously:
emission of a photon pulse by the photon source; and
switching to an on state, or an open state of the deflector or deflectors.

Alternatively, at least one deflector can be controlled directly by the photon source.

At least one electron detector can have controllable exposure.

In this case, the synchronization electronics can also be arranged to control said at least one controllable electron detector, and in particular to synchronize the at least one controllable electron detector with the photon source and/or with the or each deflector.

In this case, the synchronization electronics are arranged so that the detectors record only a wanted signal, i.e. one during a period of temporal overlap during which the electron beam and the photon pulse reach the sample simultaneously.

Alternatively, the at least one controllable deflector can be controlled directly by the photon source.

Preferably, the device according to the invention can be used to carry out a stimulated or non-equilibrium electron energy-loss and energy-gain spectroscopy measurement.

Preferably, the photon source can be a laser source.

The photon source can emit pulses of a duration comprised between 30 nanoseconds (ns) and 10 femtoseconds (fs) and frequency capable of being comprised between 1 kilohertz (kHz) and 1 gigahertz (GHz).

Preferably, the photon source can be wavelength-tunable.

The optical ranges of emission of the photon source can range from terahertz (THz) to ultraviolet, and the waves emitted can be polarized and/or structured.

Non-limitatively, the pulsed photon source can be formed by any type of source:
either a pulsed photon source or
a pulsed photon source obtained by construction, such as for example by combining:
a continuous photon source, such as a laser diode, a continuous laser, etc, with
a device, in particular controllable, for allowing the passage or preventing the photons emitted by the continuous photon source, such as for example a deflector, or a diaphragm, typically electro-acoustic, or also a rotating disc allowing or blocking the passage of the photons.

The device according to the invention can comprise a moveable sample support.

Thus, it is typically possible to be able to scan all of the sample and/or to be able to position the sample in a desired position.

The device according to the invention can also comprise at least one lens positioned after the photon source, provided to focus the photon pulses on the sample.

BRIEF DESCRIPTION OF THE DRAWINGS

Other advantages and characteristics will become apparent on examining the detailed description of examples that are in no way limitative, and the attached drawings, in which.

DETAILED DESCRIPTION

It is well understood that the embodiments that will be described hereinafter are in no way limitative. Variants of the invention can be envisaged in particular comprising only a selection of the characteristics described hereinafter, in isolation from the other characteristics described, if this selection of characteristics is sufficient to confer a technical advantage or to differentiate the invention with respect to the state of the prior art. This selection comprises at least one, preferably functional, characteristic without structural details, or with only a part of the structural details if this part alone is sufficient to confer a technical advantage or to differentiate the invention with respect to the state of the prior art.

In particular, all the variants and all the embodiments described can be combined together if there is no objection to this combination from a technical point of view.

In the figures, elements common to several figures retain the same reference.

Figure 1:
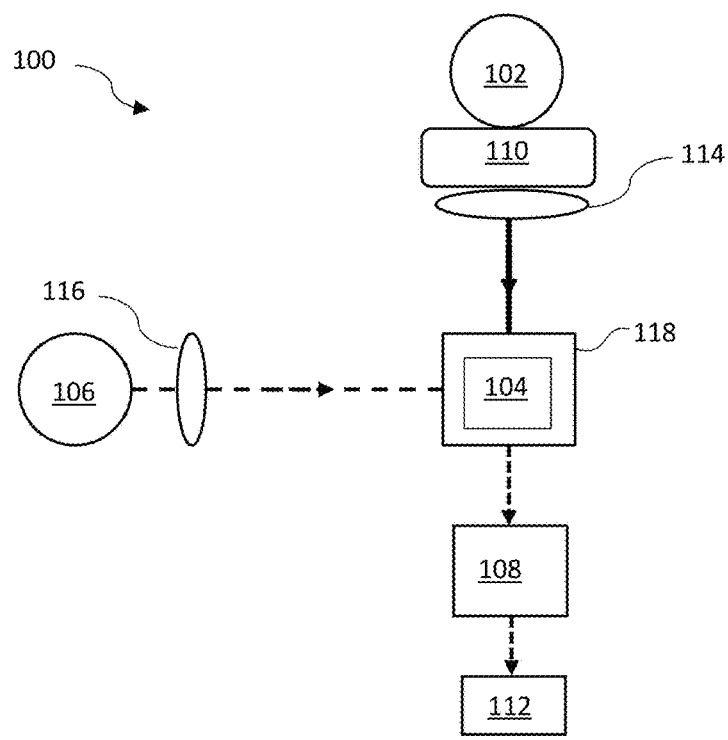
FIGS. 1 to 5 are diagrammatic representations of different non-limitative embodiment examples of a spectroscopy device according to the invention.

FIG. 1 is a diagrammatic representation of an embodiment example of a spectroscopy device according to the invention.

The device 100 is used to carry out a stimulated or non-equilibrium electron energy-loss and energy-gain spectroscopy.

The device 100 comprises:
- an electron source 102 arranged to emit a flux of electrons towards a sample 104,
- a pulsed photon source 106 emitting photon pulses towards said sample 104,
- a spectrometer 108 for energetically discriminating a flux of electrons originating from the sample 104, and
- an electron detector 112.

The spectroscopy device 100 also comprises a deflector 110, between the electron source 102 and the electron detector 112, synchronized with the pulsed photon source 106 to allow or prevent the passage of electrons emitted by said electron source 102 towards the electron detector 112.

Thus, in the device 100, the deflector 110 allows the passage of electrons that will reach the sample 104 at the same time as the photons.

The electrons originating from the sample 104 towards the detector 112 are thus electrons that have been excited by the photon pulses originating from the photon source 106.

The electron source 102 is an electron source 102 that emits a continuous flux of electrons. The electron source 102 is for example a thermal emission source, Schottky source or a cold field source.

The photon source 106 of the device 100 is typically a wavelength-tunable laser, or a fixed-wavelength laser emitting in the visible domain.

According to a non-limitative example, the photon source 106 emits laser pulses with a pulse duration $D_p$, typically of 30 ns, at a frequency of 20 kHz.

The deflector 110 is positioned between the sample 104 and the electron source 102. In particular, in the example shown in FIG. 1, the deflector 110 is positioned at the exit of the electron source 102, just after the electron source 102. In other words, the upstream deflector 110 is located between the electron source 102 and the sample 104.

Hereinafter, and in no way limitatively, the deflector 110 will be denoted "upstream deflector".

According to a non-limitative embodiment example, the upstream deflector 110 is an electrostatic deflector.

The upstream deflector 110 allows or does not allow the excitation or not of the sample 104 by the flux of electrons. In particular, the upstream deflector 110 allows the passage of the flux of electrons leaving the electron source 102 towards the sample 104, for a duration $D_{on1}$, called open duration, and prevents the passage of electrons towards the sample 104 outside this open duration $D_{on1}$.

The upstream deflector 110 positioned upstream of the sample 104 makes it possible to obtain a pulsed flux of electrons incident on the sample 104 from the continuous flux of electrons emitted by the source 102, the duration of the flux of electrons pulse being equal to the open duration $D_{on1}$ of the deflector 110.

The device 100 comprises a photonic optics system intended to convey and/or to focus the photons on the sample. In the case in FIG. 1, the photonic optics system comprises a lens 116 positioned between the photon source 106 and the sample 104 for focusing the photon pulses on the sample 104.

The device 100 comprises a photonic optics system intended to convey and/or to focus the electrons on the sample. In the case in FIG. 1, the electronic optics system comprises a lens 114, for example a magnetic lens, positioned between the electron source 102, after the deflector 110, and the sample 104, for focusing the flux of electrons on the sample 104.

The sample 104 is arranged on a mobile sample carrier 118, which makes it possible to facilitate adjustments of the device 100 and also to be able to scan the entire sample 104.

The sample 104 is positioned so as to receive both the flux of electrons and the pulses from the photon source 106.

The spectrometer 108 is positioned after the sample 104, in the direction of flow of the flux of electrons, i.e. from the electron source 102 towards the sample 104. The spectrometer 108 is arranged in particular for energetically dispersing the flux of electrons having interacted with the sample 104 at the same time as the photon pulses.

The spectrometer 108 is for example a magnetic prism 108.

The electron detector 112 is positioned after the spectrometer 108.

The electron detector 112 can be a serial detector or a parallel detector.

In a non-limitative example, the detector 112 can be a single detector or a series of detectors.

In the case in FIG. 1, the detector 112 is a serial detector detecting sequentially over time the intensity lost or gained by the electrons.

The detector 112 also comprises a rectangular slit (not shown in FIG. 1), positioned upstream of the detector 112.

The electron detector 112 is arranged to capture one or more electrons having interacted with the sample 104. The electron detector 112 makes it possible in particular to record the signal measured by the spectrometer 108 and to be able subsequently to exploit it.

In addition, the electron detector 112 can be a detector with controllable exposure.

For example, the open duration $D_{on1}$ of the upstream deflector 110 can be greater than the duration of the photon pulse. In this case, the temporal resolution obtained will be greater than the duration of the photon pulse delivered by the photon source 106.

Alternatively, the open duration $D_{on1}$ of the upstream deflector 110 can be equal to or greater than the duration of the photon pulse in order to obtain a temporal resolution equal to or less than the duration of the photon pulse.

Figure 2:
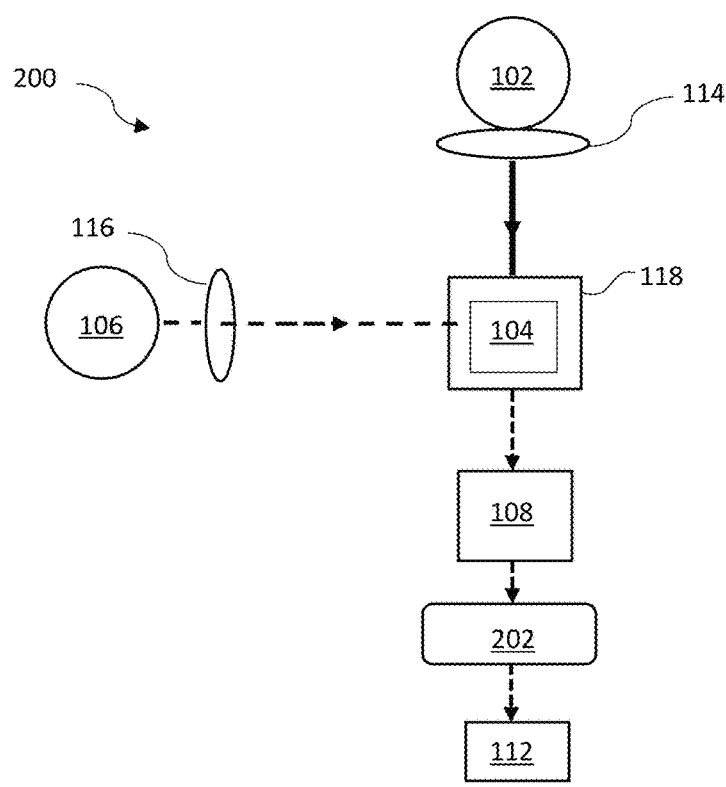

FIG. 2 is a diagrammatic representation of another embodiment example of a spectroscopy device according to the invention.

The device 200 in FIG. 2 comprises all the elements of the device 100 in FIG. 1, apart from the upstream deflector 110. Thus, the sample 104 receives the continuous flux of electrons emitted by the electron source 102. The lens 114 is placed after the exit of the electron source 102, for focusing the flux of electrons on the sample 104.

Unlike the device 100 in FIG. 1, the device 200 comprises a deflector 202, hereinafter called downstream deflector 202, positioned after the sample 104, i.e. between the sample 104 and the detector 112, for example at the exit of the spectrometer 108, as shown in FIG. 2.

The downstream deflector 202 makes it possible to select electrons originating from the sample 104 and therefore electrons that have already interacted with the sample 104, in particular at the same time as the photon pulses. In particular, the downstream deflector 202 allows the passage towards the detector 112 of the electrons originating from the sample 104, for a duration $D_{on2}$, called open duration, and prevents the passage of the electrons originating from the sample 104 outside this open duration $D_{on2}$.

For example, the open duration $D_{on2}$ of the downstream deflector 202 can be greater than the duration of the photon pulse. In this case, the temporal resolution obtained will be greater than the duration of the photon pulse delivered by the photon source 106.

Alternatively, the open duration $D_{on2}$ of the downstream deflector 202 can be equal to the duration of the photon pulse in order to obtain a temporal resolution equal to the duration of the photon pulse.

Advantageously, the direction of deflection of the deflector can be placed perpendicularly to the direction of dispersion of the spectrometer. In this case, if the detector following the spectrometer is constituted by a series of linear sub-detectors placed one after another in the direction of deflection, the temporal resolution can be greatly increased by reading the different detectors separately.

Preferentially, the deflector 202 influences the non-dispersive direction of the flux of electrons (i.e. orthogonal to the direction of dispersion of the spectrometer) so as to carry out a line-by-line scan on the detector 112. Thus, one spectrum is recorded on each line of the scanned detector 112. In this case, the temporal resolution is improved. By way of non-limitative example, for a radiation time of 100 ns (i.e. total exposure time of the detector by the flux of electrons, which also corresponds in this example to the open duration of the deflector), this makes it possible typically to achieve a resolution of 100 ns divided by the number of lines of the scanned detector, i.e. for example a resolved spectrum at 1 ns.

In the contrary case, i.e. in the case where one spectrum is recorded over the entire detector 112 during a radiation time of 100 ns, the information extracted from the detector 112 corresponds to an average spectrum recorded over 100 ns.

The downstream deflector 202 can be identical to the upstream deflector 110 of the device 100 in FIG. 1. In particular, it is possible to have $D_{on2}=D_{on1}$.

Alternatively, the downstream deflector 202 can be different from the upstream deflector 110 of the device 100 in FIG. 1. In particular, it is possible to have $D_{on2}<D_{on1}$.

Figure 3:
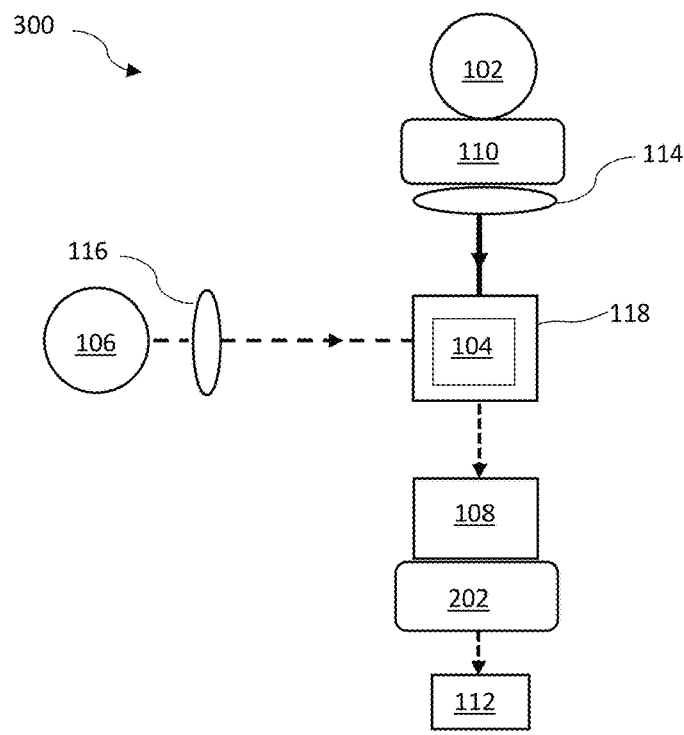

FIG. 3 is a diagrammatic representation of a third embodiment example of a spectroscopy device according to the invention.

The device 300 in FIG. 3 comprises all the elements of the devices 100 and 200 in FIGS. 1 and 2.

The device 300 thus comprises an upstream deflector 110, positioned between the electron source 102 and the sample 104, in particular at the exit of the electron source 102, and a downstream deflector 202 positioned after the sample 104, in particular at the exit of the spectrometer 108.

The two deflectors 110, 202 can be identical or different.

According to a first example, the two deflectors 110 and 202 are chosen, or configured, so that they have the same open duration: $D_{on1}=D_{on2}$.

According to a second embodiment example, the two deflectors 110 and 202 are chosen, or configured, so that the deflection duration $D_{on1}$ of the upstream deflector 110 is longer than the open duration $D_{on2}$ of the downstream deflector 202. In addition, the upstream 110 and downstream 202 deflectors are synchronized so that the open duration $D_{on2}$ of the downstream deflector 202 is comprised within the duration $D_{on1}$ of the upstream deflector 110 so that the upstream deflector 110 is open and allows the passage of electrons throughout the open duration of the downstream deflector 202.

In this case, the upstream deflector 110 is called slow, and is provided to minimize an interaction of the flux of electrons with the sample 104 when the sample 104 is not illuminated by the photon source 106. This makes it possible in particular to limit the damage to the sample 104 by the electron source 102.

The downstream deflector 202 is called quick.

In all cases, and regardless of the embodiment shown, each deflector 110 and 202 is synchronized with the photon source 106. When the device comprises several deflectors, for example an upstream deflector 110 and a downstream deflector 202 as in FIG. 3, the deflectors 110 and 202 are synchronized with each other and/or with the photon source 106.

At least one deflector can be open before, at the same time as, or after the start of emission of a photon pulse.

At least one deflector can be closed before, at the same time as, or after the end of emission of a photon pulse.

In the case where the device comprises an upstream deflector 110 and a downstream deflector 202:
 the upstream deflector 110 can be open at the same time as, or just before, the start of emission of a photon pulse, and closed at the same time as, or just after, the end of emission of a photon pulse;
 the downstream deflector 202 can be open at the same time as, or after, the start of emission of a photon pulse, and closed at the same time as, or just before, the end of emission of a photon pulse.

Figure 4:
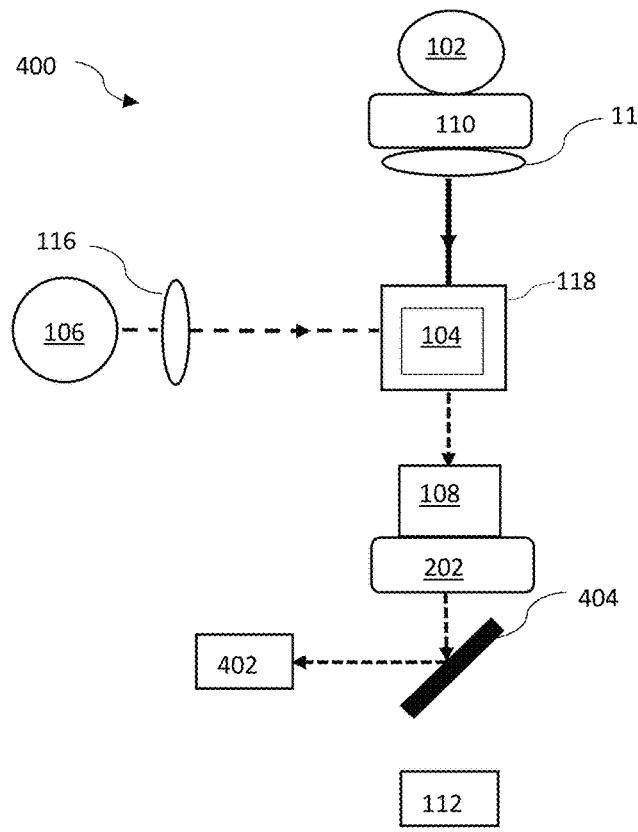

FIG. 4 is a diagrammatic representation of another embodiment example of a spectroscopy device according to the invention.

The device 400 in FIG. 4 includes all the elements of the device 300 in FIG. 3.

The device 400 comprises, in addition to the electron detector 112, a second electron detector 402.

The detector 112 is positioned in the direction of propagation of the flux of electrons at the exit of the spectrometer 108 and axially aligned with the exit of the spectrometer 108.

The second detector 402 is positioned offset, and in particular in a direction forming an angle of 45°, with respect to the axis of propagation of the electron beam, at the exit of the spectrometer 108.

The detector 402 can be a parallel detector or a serial detector. In the case in question, the detector 402 is a parallel detector.

The device 400 also comprises a static deflector or a magnetic prism 404, positioned after the downstream deflector 202 and before the detectors 112 and 402. The static deflector or the magnetic prism 404, when it is activated, is arranged for:
 blocking the flux of electrons leaving the downstream deflector 202 towards the detector 112, and
 diverting all of the flux of electrons leaving the downstream deflector 202 towards the detector 402.

Thus, only the detector 402 receives the flux of electrons leaving the deflector 202.

The electron detector 402 can be a detector with controllable exposure.

In all the examples described, at least one deflector 110 and 202 can be commanded by the photon source 106.

At least one electron detector 112 and 402 with controllable exposure can be controlled by the photon source 106.

Alternatively, the device according to the invention can utilize synchronization electronics 502, for commanding the photon source 106 and at least one deflector 110 and 202 and, if necessary, at least one electron detector 112 and 402 with controllable exposure.

Figure 5:
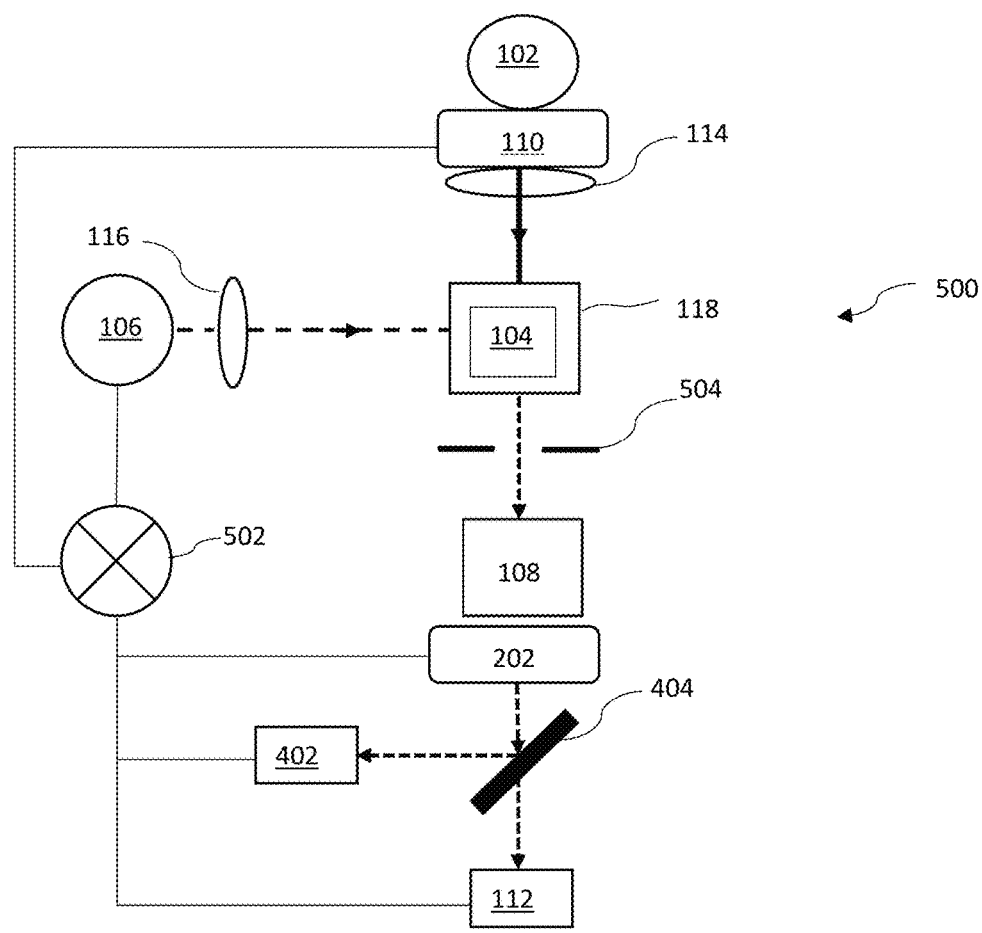

FIG. 5 is a diagrammatic representation of another embodiment example of a spectroscopy device according to the invention.

The device 500 in FIG. 5 includes all the elements of the device 400 in FIG. 4.

The device 500 also comprises synchronization electronics 502 connected by wire to the photon source 106, to the upstream deflector 110, to the downstream deflector 202. The synchronization electronics 502 makes it possible to synchronize the upstream deflector 110 and the quick deflector 202 with the photon pulses.

The synchronization electronics 502 are typically a microcontroller arranged on a printed circuit and comprising the peripheral outputs for connecting by wire to the elements mentioned above.

According to a first example, synchronized with the emission of a photon pulse, the synchronization electronics 502 send:
- a command signal to the upstream deflector 110 to place this deflector 110 in an "open" state allowing the passage of electrons towards the sample 104; and
- a command signal to the downstream deflector 202 to place this deflector 202 in an "open" state allowing the passage of electrons towards the electron detector or detectors 112 and 402.

Alternatively, the synchronization electronics 502 can also command the emission of the photon pulses by the photon source 106. In this case the synchronization electronics 502 send:
- a command signal to the photon source 106 to initiate the emission of a photon pulse;
- a command signal to the upstream deflector 110 to place this deflector 110 in an "open" state allowing the passage of electrons towards the sample 104; and
- a command signal to the downstream deflector 202 to place this deflector 202 in an "open" state allowing the passage of electrons towards the detectors 112 and 402.

The order of emission of the command signals can vary as a function of the order in which the deflectors 110 and 202 are open or closed, with respect to the emission of a photon pulse.

The synchronization electronics 502 can also be used for commanding the exposure of at least one of the electron detectors 112 and 402. In this case, the synchronization electronics 502 can be connected by wire to said at least one electron detector 112 and 402. In this case, the mirror 404 can also be controllable to affect or not to affect the flux of electrons in order to illuminate the detectors 112 or the detector 402.

Of course, the synchronization electronics 502 can be used in combination with the examples described in FIGS. 1-3.

In addition, in all the examples described, the device according to the invention can comprise a dark-field detector 504, positioned between the sample 104 and the spectrometer 108, as shown in FIG. 5. The dark-field detector 504 is arranged to capture the photons scattered by the sample 104 following the excitation of the sample 104 by the photon pulses. The dark-field detector 504 also acts as a diaphragm in front of the spectrometer 108.

Figure 6:
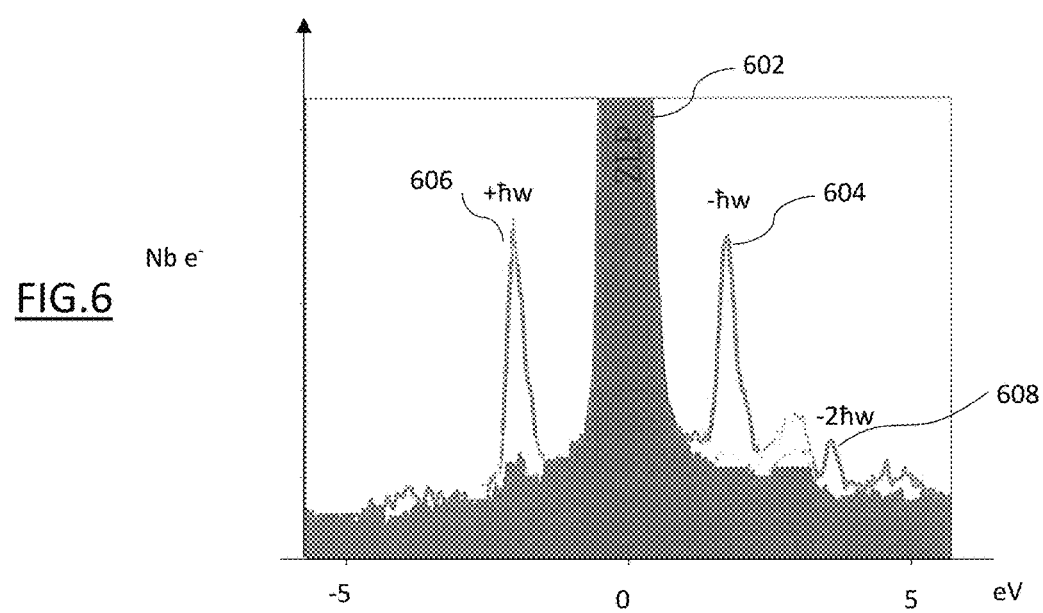
FIG. 6 is an example measurement result that is in no way limitative obtained by a device according to the invention.

FIG. 6 is an example result obtained by a spectroscopy device according to the invention, such as for example any one of the devices in FIGS. 1 to 5.

In particular, FIG. 6 shows a stimulated or non-equilibrium energy loss and gain spectrum expressing a number of electrons on the y-axis as a function of energy in electron volts (eV) on the x-axis.

Different energy peaks are shown in said FIG. 6:
- a central zone, called zero loss peak 602, referenced ZLP and aligned at 0 eV: this peak 602 represents the electrons that have not interacted with the photon pulses;
- two main energy peaks 604 and 606, approximately symmetrical with respect to the peak ZLP 602, of energy $+\hbar w$ for the stimulated gain signal 606 and of energy $-\hbar w$ for the stimulated energy loss signal 604; and
- a non-stimulated energy loss signal 608 of energy $-\hbar w$ representing a plasmon peak 608.

The energy $\hbar w$ in FIG. 6 represents the excitation energy created by the photon pulses.

By way of example, in all the devices (100; 200; 300; 400; 500) according to the invention, the sample 104 typically is approximately one hundred nanometres in the direction of propagation of the electron beam. Considering that the electron has a typical velocity of the order of one third of the speed of light, a time of passage of the electron in the sample 104 is obtained, and this time is typically 1 fs for the device 100.

Moreover, in all the devices described, the electronic optics system surrounding the deflector can be capable of participating in:
- focusing the flux of electrons in the dispersive direction, for example by adjusting the energy dispersion of the flux of electrons, and
- focusing the flux of electrons on the non-dispersive direction thereof (i.e. orthogonal to the direction of propagation of the flux of electrons), for example by focusing the flux of electrons on a given line of the detector (112; 402).

Of course, the invention is not limited to the examples that have just been described. Numerous modifications can be made to these examples without departing from the scope of the present invention as described.

The invention claimed is:

1. A spectroscopy device, comprising:
   an electron source arranged to emit a flux of electrons towards a sample;
   a pulsed photon source emitting photon pulses towards said sample;
   at least one spectrometer for energetically dispersing a flux of electrons originating from the sample;
   at least one electron detector;
   at least one deflector between the electron source and the at least one electron detector, synchronized with said pulsed photon source to allow the passage of electrons emitted by said electron source towards said at least one electron detector in an open state of the at least one deflector and prevent the passage of electrons emitted by said electron source, towards said at least one electron detector in a closed state of the at least one deflector; and
   synchronization electronics arranged to synchronize the at least one deflector with the photon source, wherein the synchronization electronics are configured to send command signals to place the at least one deflector in the open state and in the closed state.

2. The device according to claim 1, wherein the electron source is arranged to emit a continuous flux of electrons.

3. The device according to claim 1, further comprising at least one upstream deflector positioned between the sample and the electron source.

4. The device according to claim 3, further comprising:
at least one downstream deflector.

5. The device according to claim 4, wherein the at least one upstream deflector has an open duration greater than the open duration of the at least one downstream deflector.

6. The device according to claim 1, further comprising at least one downstream deflector positioned between the sample and the at least one electron detector.

7. The device according to claim 1, wherein the at least one deflector is a magnetic, electrostatic, photo-initiated deflector or a radiofrequency cavity.

8. The device according to claim 7, further comprising several detectors positioned downstream of the spectrometer.

9. The device according to claim 1, wherein the at least one electron detector has controllable exposure.

10. The device according to claim 1, wherein the synchronization electronics are arranged to synchronize the at least one controllable electron detector with the photon source and/or the at least one deflector.

11. The device according to claim 1, wherein the photon source is a pulsed laser source.

12. The device according to claim 1, wherein the photon source is wavelength-tunable.

13. The device according to claim 1, further comprising a moveable sample support.

\* \* \* \* \*